United States Patent [19]

Booher

[11] 4,006,458
[45] Feb. 1, 1977

[54] DETECTOR CIRCUIT

[75] Inventor: Robert K. Booher, Mission Viejo, Calif.

[73] Assignee: Rockwell International Corporation, El Segundo, Calif.

[22] Filed: Feb. 9, 1976

[21] Appl. No.: 656,777

[52] U.S. Cl. .................. 340/147 R; 340/166 R
[51] Int. Cl.[2] .................. H04Q 3/00
[58] Field of Search .................. 340/147 R, 166 R

[56] References Cited
UNITED STATES PATENTS 3,609,661  9/1971  Hennes .................. 340/166

*Primary Examiner*—Harold I. Pitts
*Attorney, Agent, or Firm*—H. Fredrick Hamann; G. Donald Weber, Jr.; Morland Charles Fischer

[57] ABSTRACT

A unique sense circuit to implement a differential memory detector having increased sensitivity for reading the binary state of selected memory cells forming an array thereof. The detector, in a preferred embodiment, includes a circuit comprised of a plurality of metal oxide semiconductor field effect transistors fabricated from a layer of silicon on sapphire (SOS/FETs). The body node of each of a pair of SOS/FETs is respectfully connected to a data bus line of the memory array so as to form differential input nodes to the detector circuit. The instant detector circuit provides relatively large digital output signals from relatively small input signals supplied from the array of memory cells via the data bus lines.

10 Claims, 2 Drawing Figures

1 …

DETECTOR CIRCUIT

BACKGROUND OF THE INVENTION

1. Field of the Invention

This invention relates to a differential detector circuit, comprised of a plurality of MOSFETs fabricated, in a preferred embodiment, by silicon on sapphire techniques for reading binary data from an array of memory cells.

2. Prior Art

A conventional array of memory cells includes pairs of data bus lines, by which to write and read information signals, and a row or address select line, by which to select from the array a particular memory cell to be accessed. Typically, a sense circuit associated with the array of memory cells is comprised of a detector circuit and a memory output driver which are connected to each of the pairs of data bus lines. Information is read from each of the memory cells forming the array by utilizing differential sensing of signals along the data bus lines.

Conventional detector circuits are relatively insensitive to the signals supplied along the data bus lines. In order to tolerate the low sensitivity of the detector circuit, it has heretofore been a common technique to undesirably limit the number of memory cells in the array. Another conventional technique is to increase the storage capacitance of each memory cell, thereby increasing the ratio of the storage capacitance to the capacitance along the bus lines. However, as a result thereof, the larger storage capacitance must first be charged when addressing a memory cell in order to read out data. Thus, the read operation is undesirably slowed.

When the detector circuit is comprised of field effect transistors fabricated from a layer of silicon on a sapphire substrate (SOS), it is customary, in the prior art, to allow the substrate under each one of the SOS transistors to float free from any source of potential. Consequently, the body node (i.e. a lightly doped region formed under the channel region of the SOS transistor) also floats free from any source of potential. This has a further effect of minimizing the sensitivity of the detector and the size of an output signal therefrom.

SUMMARY OF THE INVENTION

Briefly, and in general terms, a differential memory read detector is disclosed to provide relatively large digital output signals from relatively small input signals. The instant detector is connected to each of a pair of data bus lines. The data bus lines are connected to an array of memory cells in order to supply information signals indicative of the binary state of a selected memory cell of the array. In a preferred embodiment, the circuit which implements the detector is comprised of a plurality of metal oxide semiconductor field effect transistors fabricated from a layer of silicon on a sapphire substrate (SOS/FETs). A body node inherently formed under the channel region of each of a first pair of SOS/FETs, is respectively connected to one of the pair of data bus lines. The body nodes form a pair of differential input nodes to the instant detector circuit. A change in the potential between the data bus lines when a selected memory cell is read unbalances the substrate potential of the first pair of SOS/FETs through the body nodes thereof. The pair of body input nodes reflects a change in the differential potential thereacross to effectively raise the threshold of one of the first pair of SOS/FETs with respect to the second of the pair. Thus, the one SOS/FET is rendered conductive before the second, depending upon the logic level signal on each of the data bus lines. The second of the first pair of SOS/FETs is subsequently rendered non-conductive, because of insufficient threshold potential. A data node, connected to each of the first pair of SOS/FETs, assumes a voltage indicative of the logic level of the respective signals on the data bus lines.

The body nodes of a second pair of SOS/FETs are clamped to a source of relatively low reference potential, such as ground. The body nodes of a third pair of SOS/FETs may be connected to the source of relatively low reference potential or may float free from any potential. The instant detector circuit is synchronously controlled by a supply of clock signals. The clock signals are supplied to the gate or control electrodes of each of the transistors comprising the second and third pairs thereof. A clock input terminal is connected to each of the gate electrodes of the third pair of transistors through a signal delay and inverting means. Thus, during certain intervals of the clock signals, the binary signal level of the clock signals at each of the gate electrodes of the third pair of transistors is opposite in polarity to those clock signals received at each of the gate electrodes of the second pair of transistors.

DESCRIPTION OF THE PREFERRED EMBODIMENT

Figure 1:
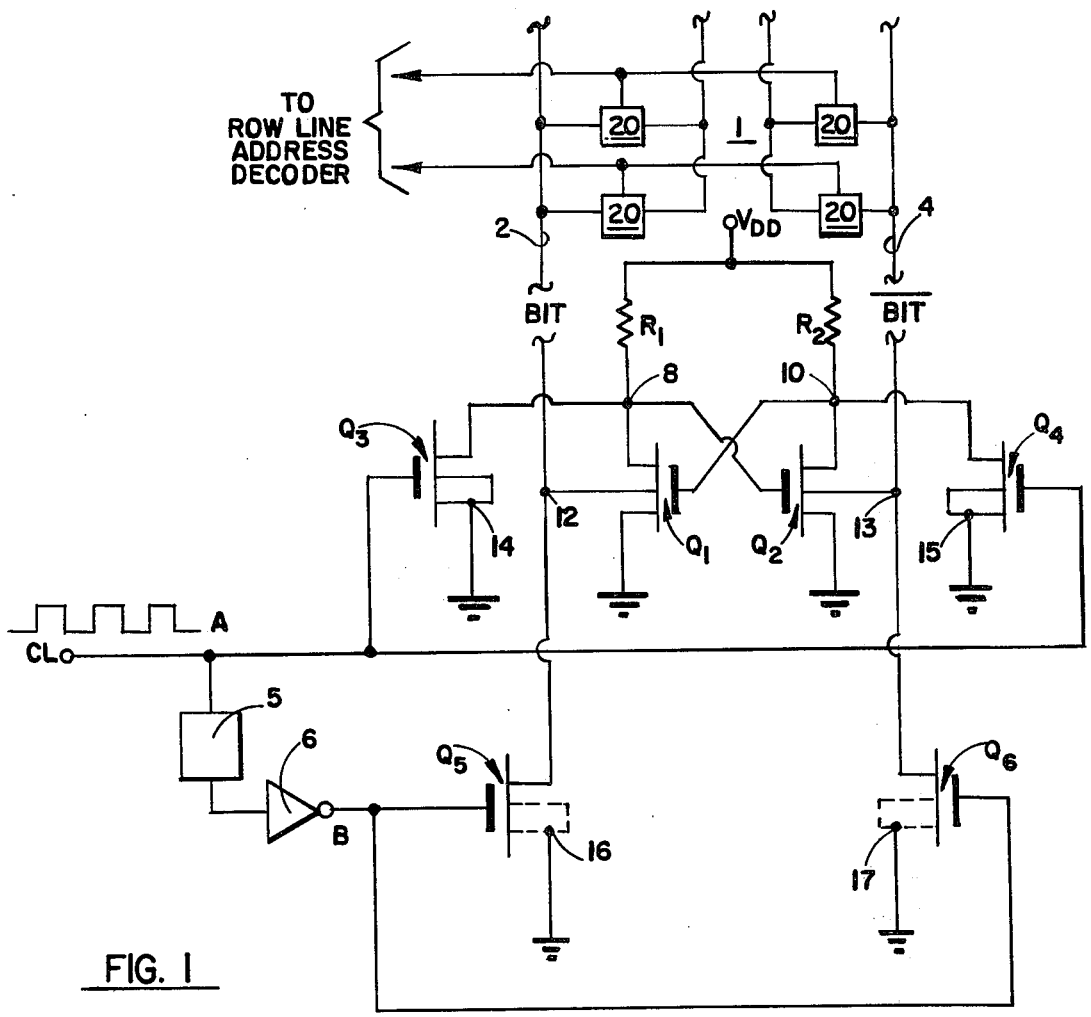
FIG. 1 schematically shows the circuit of the instant invention to implement a differential detector having increased sensitivity.

Referring to the schematic of FIG. 1, a unique circuit to implement a differential memory read detector, having increased sensitivity, is shown. Such a detector has utility, for example, for providing relatively large digital output signals from relatively small input signals which are indicative of the binary state of selected memory cells 20 that comprise a conventional memory array 1. As is well known, a conventional memory array 1 includes a BIT data bus line 2, an opposite state $\overline{\text{BIT}}$ data bus line 4 and row and column line address decoders (not shown). Typically, a sense circuit detector is connected to each of the data bus lines 2 and 4. Binary information corresponding to the logical state of a selected memory cell of the array is read by means of differential sensing of signals along the data bus lines 2 and 4.

The circuit for the detector of the instant invention is comprised of a plurality of transistors $Q_1 - Q_6$. In a preferred embodiment, transistors $Q_1 - Q_6$ are n-channel metal oxide semiconductor (NMOS) field effect transistors (FETs) fabricated from a layer of silicon on a sapphire substrate (SOS). A source of potential $V_{DD}$ is connected through current limiting resistors $R_1$ and $R_2$ to a first of the conduction path electrodes of each of the FETs $Q_1$ and $Q_2$. Typically, the potential of source $V_{DD}$ is in a range of between 3 to 15 v. dc. The second of the conduction path electrodes of each of the FETs $Q_1$ and $Q_2$ is connected to a source of reference potential, such as ground. The gate electrodes of FETs $Q_1$ and $Q_2$ are connected in a cross-coupled relationship. More particularly, the gate electrode of FET $Q_1$ is connected to opposite data node 10 to form a common electrical junction with current limiting resistor $R_2$ and the first conduction path electrode of FET $Q_2$. The gate electrode of FET $Q_2$ is connected to opposite data node 8 to form a common electrical junction with current limiting resistor $R_1$ and the first conduction path electrode of FET $Q_1$.

A first of the conduction path electrodes of FET $Q_3$ is connected at the common electrical junction formed by data node 8. A first of the conduction path electrodes of FET $Q_4$ is connected at the common electrical junction formed by data node 10. The second of the conduction path electrodes of each FET $Q_3$ and $Q_4$ is connected to a source of reference potential, such as ground.

The detector circuit is synchronously controlled by a suitable clock signal generator (not shown). Clock input terminal CL, which is adapted to receive the clock signals from the generator thereof, is connected to the gate electrode of each FET $Q_3$ and $Q_4$. The clock input terminal CL is further connected to the gate electrodes of FETs $Q_5$ and $Q_6$ through a suitable inverter-delay means. One example of a suitable inverter-delay means, and that which is presently employed, is the series connection of a conventional delay line 5 and a signal inverting gate 6. During certain time intervals of the clock cycle, the binary signal level of those clock signals received at the gate electrodes of FETs $Q_5$ and $Q_6$ is opposite in binary state to those clock signals received at the gate electrodes of FETs $Q_3$ and $Q_4$, as a result of delay means 5 and inverter gate 6.

BIT data bus line 2 is connected to one of the conduction path electrodes of FET $Q_5$. $\overline{BIT}$ data bus line 4 is connected to one of the conduction path electrodes of FET $Q_6$. The second of the conduction path electrodes of each FET $Q_5$ and $Q_6$ is connected to a source of reference potential, such as ground.

As is common to field effect transistors fabricated from silicon on sapphire techniques, a body node is formed, for example, within a lightly doped P region between the conduction path electrodes of an n-channel device. The substrate and the body nodes of the SOS/FETs comprising conventional detector circuits typically float free from any source of potential.

In accordance with the instant invention, each of the body nodes 12 and 13 of SOS/FETs $Q_1$ and $Q_2$, respectively, is connected to data bus lines 2 and 4 so as to form a pair of differential input nodes to the instant detector circuit, as will be explained in greater detail hereinafter. Each of the body nodes 14 and 15 of SOS/FETs $Q_3$ and $Q_4$, respectively, is clamped to a source of relatively LOW reference potential, such as ground. The body nodes 16 and 17 of SOS/FETs $Q_5$ and $Q_6$, respectively, may be clamped to the source of relatively LOW reference potential (as suggested by the dashed line connection) or be left floating free of potential.

In a preferred embodiment, in order to provide a detector having maximum sensitivity, the instant detector circuit is initially physically and electrically balanced. In other words, the electrical parameters (e.g. resistance, threshold, capacitance, etc.) of the elements $R_1$, FETs $Q_1$, $Q_3$, $Q_5$, and bus line 2 forming one half of the detector circuit are matched with the corresponding elements $R_2$, FETs $Q_2$, $Q_4$, $Q_6$, and bus line 4, forming the adjacent half of the circuit.

Figure 2:
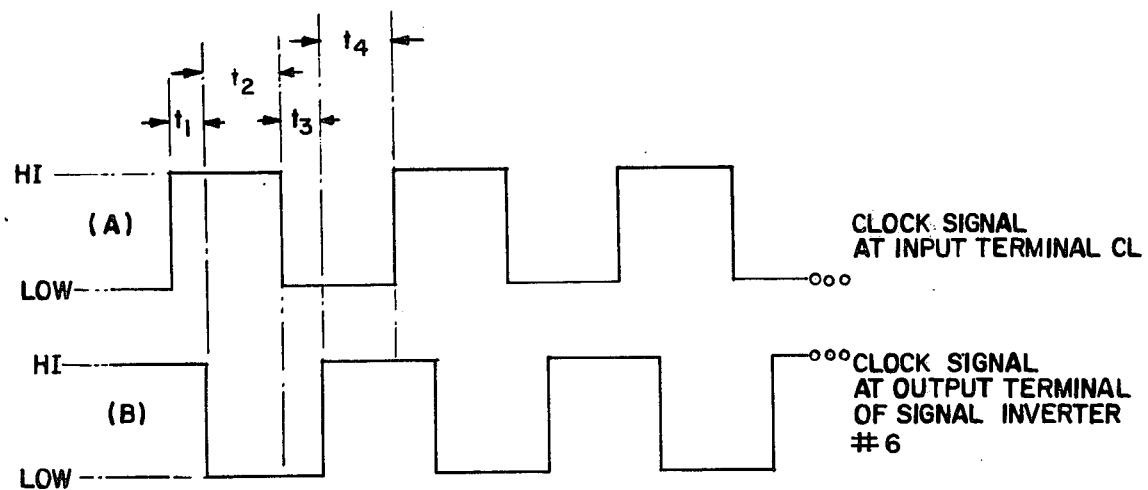
FIG. 2 shows respective waveforms representative of a clock control signal at a clock input terminal and at the output terminal of a signal delay and inverting means of the circuit of FIG. 1.

In operation, and referring concurrently to FIGS. 1 and 2, during an interval of time of the clock signal designated $t_1$, the logic level of the clock signal at input terminal CL is relatively HI (i.e. true). The gate electrodes of FETs $Q_3$ and $Q_4$ are supplied with a HI logic level enabling signal. As a result thereof, FETs $Q_3$ and $Q_4$ are rendered conductive. Detector data nodes 8 and 10 assume the potential of ground, inasmuch as each one of the data nodes 8 and 10 is clamped through the respective conduction paths of FETs $Q_3$ and $Q_4$. FETs $Q_1$ and $Q_2$ are rendered non-conductive, inasmuch as the respective gate electrodes thereof are connected in a cross-coupled relationship to data nodes 10 and 8, as previously disclosed. As a result of delay means 5 and inverter 6, a relatively HI logic level enabling signal is also supplied to each of the gate electrodes of FETs $Q_5$ and $Q_6$ from the output terminal of inverter 6 during the $t_1$ clock interval. Consequently, FETs $Q_5$ and $Q_6$ are rendered conductive. The body input nodes 12 and 13 of FETs $Q_1$ and $Q_2$ are clamped to ground through the respective conduction paths of FETs $Q_5$ and $Q_6$. The detector circuit is cleared of any information sensed during the preceding clock cycle and is thereby reset.

During an interval of time of the clock signal designated $t_2$, the logic level of the clock signal at input terminal CL is still relatively HI. Each of the gate electrodes of FETs $Q_3$ and $Q_4$ continue to be supplied with the HI logic level enabling signal, and FETs $Q_3$ and $Q_4$ remain conductive. Detector data nodes 8 and 10 remain clamped to ground through the respective conduction paths of FETs $Q_3$ and $Q_4$. Hence, FETs $Q_1$ and $Q_2$ are thereby also rendered non-conductive. However, a relatively LOW (i.e. false) logic level signal is supplied to the gate electrodes of FETs $Q_5$ and $Q_6$ from the output terminal of inverter 6. Consequently, FETs $Q_5$ and $Q_6$ are now rendered non-conductive.

During an interval of time of the clock signal designated $t_3$, the logic level of the clock signal at input terminal CL switches to a relatively LOW logic level signal. The gate electrodes of FETs $Q_3$ and $Q_4$ are supplied with the LOW logic level signal, and FETs $Q_3$ and $Q_4$ are both rendered non-conductive. As a result of delay means 5 and inverter 6, a relatively LOW logic level signal continues to be supplied to the gate electrodes of FETs $Q_5$ and $Q_6$ from the output terminal of inverter 6 during the $t_3$ clock interval. Consequently, FETs $Q_5$ and $Q_6$ remain nonconductive. The body input nodes 12 and 13 of SOS/FETs $Q_1$ and $Q_2$, respectively connected to BIT data bus line 2 and $\overline{BIT}$ data bus line 4, are no longer clamped to ground, but now have a differential potential therebetween, because of a respective change in the potential along bus lines 2 and 4 caused by a selected memory cell to be read. Therefore, the substrates of FETs $Q_1$ and $Q_2$ also assume different potentials. Thus, the threshold potential of FET $Q_1$ is effectively made lower than the threshold potential of FET $Q_2$, or vice versa, because of the differential signals at body input nodes 12 and 13.

During the $t_3$ clock interval, the potential of each of the detector data nodes 8 and 10 begins to rise toward that of supply voltage $V_{DD}$, inasmuch as the conduction paths of FETs $Q_3$ and $Q_4$ are not presently active. Depending upon the logic level of the selected memory cell and the corresponding signals provided along bus lines 2 and 4 and at the body input nodes 12 and 13, one of the pair of SOS/FETs $Q_1$ and $Q_2$ will be rendered conductive before the other. Upon being rendered conductive, the one of the pair of FETs $Q_1$ and $Q_2$ clamps the associated detector data node 8 or 10 to ground through the conduction path thereof. The clamped data node assumes a voltage indicative of a LOW logic level signal. Because of an insufficient threshold potential, the other of the pair of FETs $Q_1$ and $Q_2$, having its gate electrode connected to the first of the detector data nodes 8 and 10, will be rendered non-conductive. Thus, the associated other data node charges to assume a voltage (e.g. $V_{DD}$) indicative of a HI logic level signal. The detector circuit reflects the initial potential differential between body input nodes 12 and 13 as the detector data nodes 8 and 10 provide digital signals representative of either a HI or LOW logic level signal. The selected memory cell from the array has, therefore, been read by the conclusion of the $t_3$ clock interval.

During an interval of time of the clock signal designated $t_4$, the clock signal at input terminal CL is still relatively false. Each of the gate electrodes of FETs $Q_3$ and $Q_4$ continue to be supplied with a LOW logic level signal, and FETs $Q_3$ and $Q_4$ remain non-conductive. As a result of the delay means 5 and inverter 6, a HI logic level enabling signal is applied to each of the gate electrode of FETs $Q_5$ and $Q_6$ from the output terminal of inverter 6. FETs $Q_5$ and $Q_6$ are thereupon rendered conductive. Body nodes 12 and 13 are respectively clamped to ground through the conduction paths of FETs $Q_5$ and $Q_6$. Hence, the differential voltage signal is removed from between body nodes 12 and 13. However, sufficient threshold potential is applied to the gate electrode of the first of the pair of SOS/FETs $Q_1$ and $Q_2$ from voltage supply $V_{DD}$ through the second of the detector data nodes 8 and 10 to render the first of the FETs conductive. Concurrently therewith, the gate electrode of the second of the pair of SOS/FETs $Q_1$ and $Q_2$ is clamped to ground through the first of the detector data nodes 8 and 10, and the second of the FETs is rendered non-conductive.

By virtue of the instant invention, an improved differential read detector circuit with increased sensitivity can be utilized to provide relatively large digital output signals from relatively small input signals occurring on the data bus lines. A relatively small change in the potential along the BIT and $\overline{BIT}$ data bus lines 2 and 4 is reflected as relatively large logic level signals at data nodes 8 and 10. The relatively low level signals supplied from the memory call array via bus lines 2 and 4 may be smaller than the threshold of either of FETs $Q_1$ or $Q_2$. However, in accordance with the instant invention, the body input nodes 12 and 13 reflects a change in the differential potential thereacross to effectively raise the threshold of one of the SOS/FETs $Q_1$ and $Q_2$ with respect to ground. Hence, the first of the FETs $Q_1$ and $Q_2$ will be turned on harder while the second of the FETs $Q_1$ and $Q_2$ will be turned off. A regenerative current effect is established at the gate electrodes of FETs $Q_1$ and $Q_2$, and a data latch is thereby formed.

It will be apparent, that while a preferred embodiment of the invention has been shown and described, various modifications and changes may be made without departing from the true spirit and scope of the invention. For example, while FETs $Q_1$–$Q_6$ are disclosed as n-channel devices, any other suitable semiconductor device is contemplated herein. Moreover, while FETs $Q_1$ – $Q_6$ have, in a preferred embodiment, been described as being fabricated from a layer of silicon on a sapphire substrate, FETs $Q_1$ – $Q_6$ may be fabricated from any other suitable semiconductor material on an insulating substrate. As will be understood by those skilled in the art, the conducting modes of FETs $Q_1$ – $Q_6$ and the corresponding logic levels of data nodes 8 and 10 are dependent upon the type of device employed and the logic level of the signals on data bus lines 2 and 4.

Having set forth a preferred embodiment of the instant invention, what is claimed is:

1. In combination:
  information signal source means,
  data bus line means connected to receive information signals from said information signal source means,
  circuit means adapted to sense said information signals along said data bus lines means, said circuit means including a plurality of multi-terminal semiconductor devices having a body node formed between conduction path terminals thereof, and
  means to connect at least some of said body nodes to said data bus line means.

2. The combination recited in claim 1, wherein said multi-terminal semiconductor devices are fabricated from a layer of silicon on a sapphire substrate.

3. The combination recited in claim 1, wherein at least some other of said body nodes are connected to a source of reference potential.

4. The combination recited in claim 3, wherein said source of reference potential is ground.

5. The combination recited in claim 1, wherein said information signal source means includes at least one memory cell means having an information signal stored therein.

6. The combination recited in claim 1, wherein a control terminal of each one of a pair of said multi-terminal semiconductor devices is respectively connected in a cross-coupled relationship to one of the conduction path terminals of the other of said pair of devices, the body nodes of each of said pair of devices connected to said data bus line means.

7. The combination recited in claim 1, including clock terminal means to receive a supply of clock signals, said clock terminal means connected to control terminals of at least some other of said plurality of multi-terminal semiconductor devices to synchronously control the operation thereof.

8. Memory cell means for storing information, data bus line means connected to receive signals from said memory cell means indicative of the information stored therein and detector circuit means connected to said data bus line means to sense the condition of said information signals, said detector circuit means comprising:
  a plurality of multi-terminal semiconductor devices, each of said devices having conduction path terminals and a control terminal,
  at least a first and second of said multi-terminal devices having a body node formed between said control terminals thereof, and
  means to respectively connect the body nodes of the first and second of said devices to said data bus line means, whereby the condition of said information signals is reflected by a corresponding potential difference between said body nodes of said first and second devices.

9. The memory cell means recited in claim 8, wherein each of said first and second multi-terminal devices is fabricated from a layer of silicon on a sapphire substrate.

10. A detector circuit for sensing the logical state of information signals supplied along first and second data bus line means, said detector circuit comprising:
a plurality of semiconductor devices, each of said semiconductor devices having at least four terminals thereof,
first and second conduction path terminals of each one of at least a pair of said plurality of devices selectively connected to a reference potential source means,
third control terminals of each one of said pairs of devices connected to one of said conduction path terminals of the other of said pair of devices, and
fourth terminals of each one of said pair of devices respectively connected to one of said first and second data bus lines means so as to provide a differential input signal to said detector circuit.

* * * * *